(12) United States Patent
Pieper et al.

(10) Patent No.: US 6,505,136 B1
(45) Date of Patent: Jan. 7, 2003

(54) METHOD OF TESTING AN EVALUATION CIRCUIT

(75) Inventors: Norbert Pieper, Olfen (DE); Wolfgang Zimmermann, Bochum (DE)

(73) Assignee: Nokia Mobile Phones Ltd, Espoo (FI)

( * ) Notice: Subject to any disclaimer, the term of this patent is extended or adjusted under 35 U.S.C. 154(b) by 0 days.

(21) Appl. No.: 09/572,612

(22) Filed: May 17, 2000

(30) Foreign Application Priority Data

May 19, 1999 (DE) .......................... 199 22 818

(51) Int. Cl.[7] .............................................. G06F 19/00
(52) U.S. Cl. ...................................... 702/117; 324/422
(58) Field of Search ........................... 702/117; 324/422

(56) References Cited

U.S. PATENT DOCUMENTS 6,188,225 B1 * 2/2001 Tislaric ...................... 324/244

* cited by examiner

*Primary Examiner*—John S. Hilten
*Assistant Examiner*—Stephen J. Cherry
(74) *Attorney, Agent, or Firm*—Ware, Fressola, Van Der Sluys & Adolphson LLP

(57) ABSTRACT

The invention concerns a method of testing an evaluation circuit (10 11), which checks the correct contact of a switch (13) with a testing means (14) in a d.c.-supplied circuit. The testing means (14) includes for example a capacitor (15) in parallel with the switch (13). The evaluation circuit (10) itself is made up of a controller (11), an input and an output buffer (17 18). To determine faulty conditions in the output buffer (17), the invention arranges that when testing for faults both the input and the output buffer (17 18) be actively connected by connecting them connected to the controller (11) via a respective data line (21 21a) for exchanging data.

2 Claims, 4 Drawing Sheets

determined at time 4 is above the threshold value $U_g$, because the unavailable capacitor causes the potential to immediately fall back to its starting position.

METHOD OF TESTING AN EVALUATION CIRCUIT

TECHNICAL AREA

The invention relates to an evaluation circuit used to test for contact between a switch or key and a testing means, and which has an input and an output buffer. More particularly, the invention relates to isolating possible causes of failure of such an evaluation circuit.

STATE OF THE ART

A method and a device for testing a key or switch is known from DE-A-19718041. To determine different failure conditions, a testing means in the form of a capacitor can be arranged for example in parallel with the switch or key. The known document, DE-A-19718041, also indicates a device with a capacitor in series with a two-way switch, where one circuit path comprising the capacitor and the switch unit short-circuits the I/O port of an evaluation circuit to ground, and the other circuit path (=off position of the switch) connects the I/O port of the evaluation circuit to ground via the capacitor. The evaluation circuit itself essentially comprises a controller, an input buffer and an output buffer, where an inverted connection between the controller and the input buffer switches the input buffer and the output buffer to different polarities.

If the correct contact of the switch or key is to be determined, the unit comprising the capacitor and the switch is first connected to the I/O port of the evaluation circuit. To simplify the illustration of the relationships when the unit contacts the I/O port, it is assumed that the switch or key is in its off position, and thus the unit connects the I/O port of the evaluation circuit to ground via the capacitor. Once the connection is established between the unit and the I/O port of the evaluation circuit, a current flows via a resistor R to the capacitor and in the known example charges the latter to $U_c$=5 volts. After that the capacitor is blocked and is in the off position, i.e. no current flows. Since there is no possibility of any discharge, the capacitor remains charged even if the switch or key is subsequently activated.

If the known device is now to be used to detect a line fault (grounding) it is necessary for the I/O port of the switch or key being tested to be read at a suitable to one, indicated as time 1 in DE-A-19718041. If the I/O port reads "Low" at time 1, it is a sure sign that grounding has taken place, since according to the above assumption the switch or the key is in its off position.

Even faulty contacts of the capacitor and of the unit formed by the capacitor and the switch or key can be determined by the known unit. To that end a change-over is brought about at a time 2 whereby the I/O port is switched from input to output and reads "Low". This causes the capacitor to discharge to the I/O port. If the capacitor is fully discharged after a time period $t_u$, the I/O port is again switched to input at a time 3. The result is that the capacitor recharges through the resistor during the time period $t_m$ and attains the charge $U_c$=5 volts. At the same time the I/O port can be read again after the switch-over at time 3, and the signal level determined at a time 4 during the time period $t_m$ can be used to determine a faulty contact by comparing it to a threshold value $U_g$. If the signal level that is determined at time 4 is below the threshold value $U_g$, it ensures that the unit formed by the capacitor and the switch or key is available and is correctly connected. An unavailable capacitor and switch or key unit is detected in that the signal level determined at time 4 is above the threshold value $U_g$, because the unavailable capacitor causes the potential to immediately fall back to its starting position.

Even if the known method or device can be used to very simply detect faulty contacts in the capacitor and switch or key unit, as well as short circuits in the line, which would also avoid lengthy trouble-shooting, a signal level which is above the threshold value $U_g$ at time 4 does not express with certainty that the unit formed by the capacitor and the switch or key actually has a faulty contact. Expensive manual activities must be used especially when this condition occurs, to verify whether the fault lies in the unit or in the evaluation circuit. For that reason the invention has the objective of presenting a method and a device that eliminates the disadvantages of the state of the art, and thereby contributes to a faster detection and elimination of the fault.

SUMMARY OF THE INVENTION

This method is achieved by a method of testing an evaluation circuit, which in a d.c.-supplied circuit tests a correct contact between a switch or key and a respectively assigned testing device, and which has an output and an input buffer, where the output buffer is active during a time period $t_u$, which together with a time period $t_m$ forms a time period $t_g$, and where the correct contact of the switch or key is tested during the time period $t_m$, characterized in that the input buffer is also active during the time period $t_u$, The objective is also achieved by a device for testing an evaluation circuit, which in a d.c.-supplied circuit tests a correct contact between a switch or key and a respectively assigned testing device, and which has a microcomputer and an input and an output buffer, characterized in that in order to exchange data with the microcomputer, the input buffer and the output buffer are connected via a data line to the microcomputer.

The method of this objective is achieved by a method of testing an evaluation circuit, which in a d.c.-supplied circuit tests a correct contact between a switch or key and a respectively assigned testing device, and which has an output and an input buffer, where the output buffer is active during a time period $t_u$, which together with a time period $t_m$ forms a time period $t_g$, and where the correct contact of the switch or key is tested during the time period $t_m$, characterized in that the input buffer is also active during the time period $t_u$, The objective is also achieved by a device for testing an evaluation circuit, which in a d.c.-supplied circuit tests a correct contact between a switch or key and a respectively assigned testing device, and which has a microcomputer and an input and an output buffer, characterized in that in order to exchange data with the microcomputer, the input buffer and the output buffer are connected via a data line to the microcomputer.

If the method is designed as claimed in claim 1, where the input buffer is also activated during the time period $t_u$, it can be used to determine whether the output functions correctly or incorrectly. For example if the output buffer functions correctly, a signal level which decreases to zero can be observed at the I/O port in the time period $t_u$ during which the capacitor is discharged. However if the output buffer is defective, the signal level remains at the previous 5 volts during the time period $t_u$. If a signal level is then determined to be above the threshold value $U_g$ at a time 4, comparing the signal level during the time period $t_u$ with the signal level at the time 4 can determine whether the signal level above the threshold value $U_g$ at a time 4 is caused by a faulty contact in the unit formed by the capacitor and switch or key, or by a defective output buffer. A defective output buffer is the cause if the two signal levels determined during the time periods $t_u$ and $t_m$ are the same or at least if the signal level that was determined during the time period $t_u$ is higher than the signal level that was determined during the time period $t_m$. The cause is a faulty contact in the capacitor and switch or key unit if the signal level, which was determined during the time period $t_u$, is lower than the signal level that was determined at the time 4. A reference between the signal levels determined during the time period $t_u$ and the time period $t_m$ is not needed to test the output buffer. Rather to detect a faulty output buffer, the signal level determined during the time period $t_u$ can also be compared to the threshold value $U_g$.

The device performs this function in that both the input as well as the output buffer are each connected to the microcomputer via a data line so that they can exchange data with the microcomputer.

BRIEF PRESENTATION OF THE FIGURES

BEST MODE FOR CARRYING OUT THE INVENTION

Figure 1:
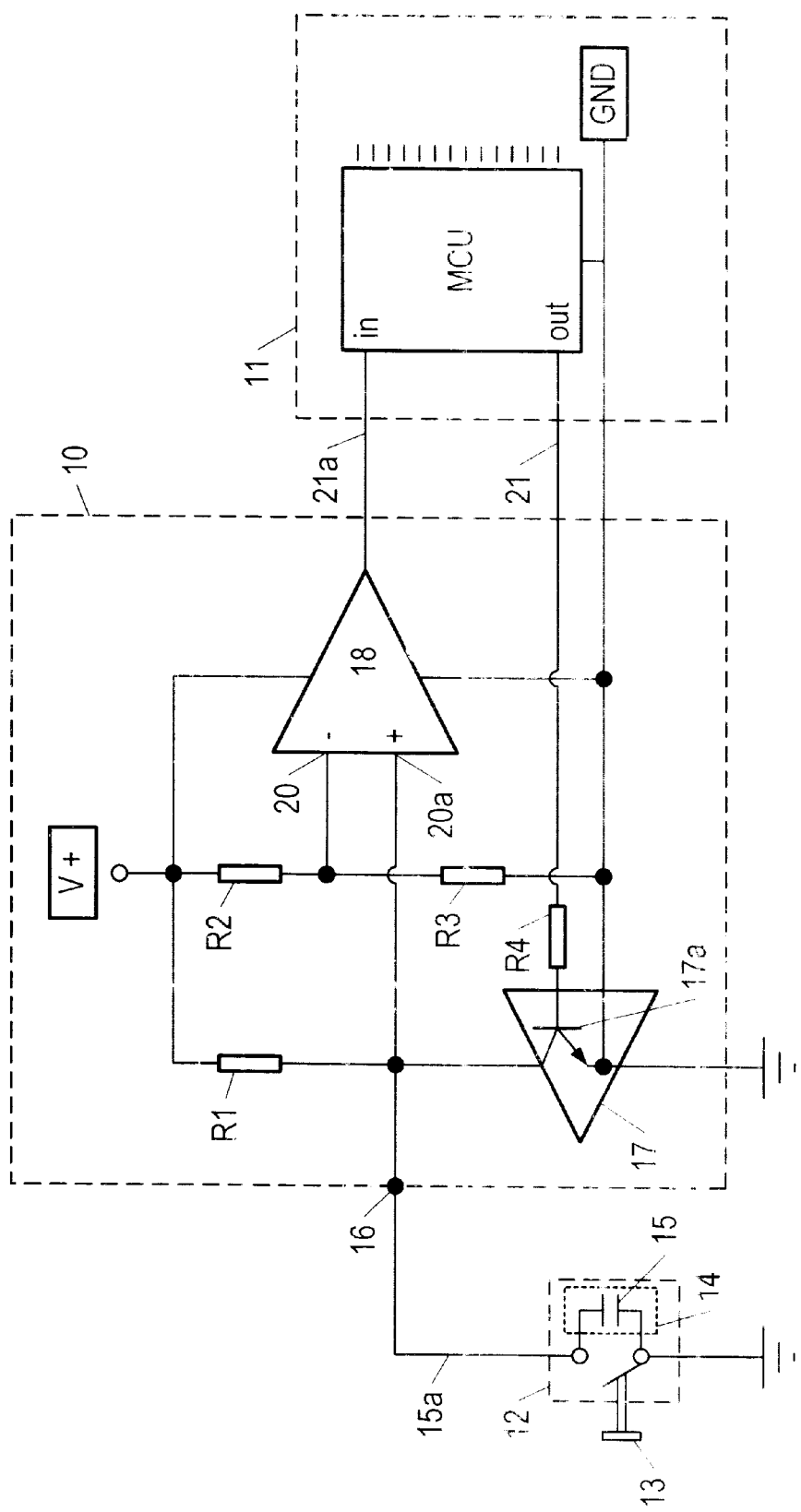
FIG. 1 is a schematic of an evaluation circuit according to the invention being used in combination with a microcomputer and a unit with a key switch and a capacitor.

The invention will now be explained in greater detail by means of the figures. The arrangement in FIG. 1 is essentially composed of an evaluation circuit 10, a microcomputer 11 and a unit 12.

Here the unit 12 comprises a key or switch 13 and a testing means 14 including a capacitor 15 that lies parallel to the key or switch 13. This unit 12 is connected to the I/O port 16 of the evaluation circuit 10 by a connection line 15*a*. While the key or switch 13 is in its off position as shown in FIG. 1, the I/O port 16 of the evaluation circuit 10 is connected to ground through the capacitor 15.

The evaluation circuit 10 essentially comprises an output buffer 17, an input buffer 18 and the resistors R1 to R4. The two resistors R2 and R3 are arranged in series. A separate data line 21, 21*a* connects the input buffer 18 and the output buffer 17 to the microcomputer 11, which essentially makes it possible to evaluate the I/O port 16 during the entire time period $t_g$ as described below.

If the unit 12 is first connected to the I/O port 16 of the evaluation circuit 10 by the connection line 15*a*, current flows through the resistor R1 to the capacitor 15 and charges it in accordance with a voltage V+. The capacitor 15 then forms a block and no further zero-signal current can flow.

Figure 2:
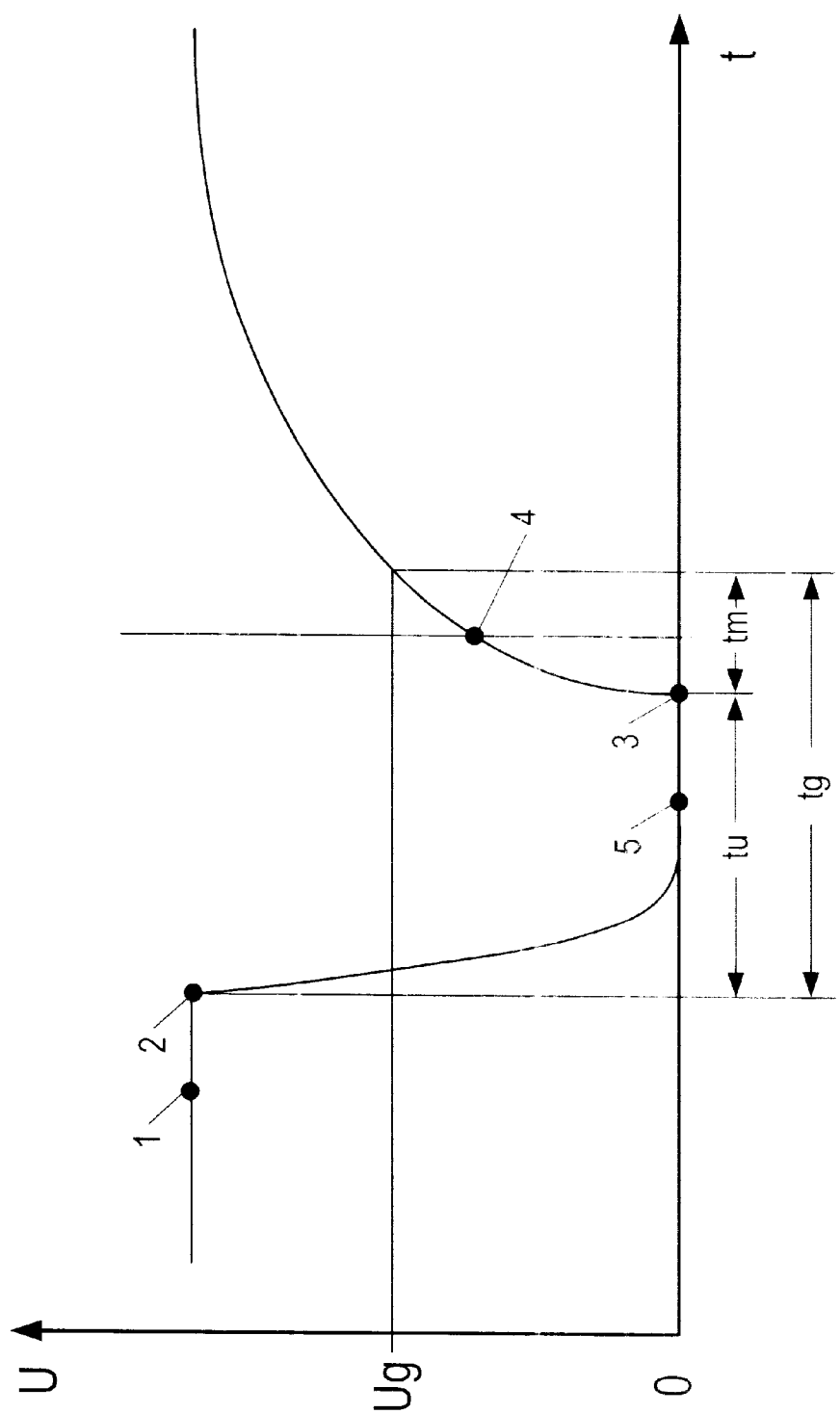
FIG. 2 is an illustration of the signal level versus time during the testing in a case where the unit is connected and the evaluation circuit is operating normally.

To detect possible short circuits to ground in the connection line 15*a*, the I/O port 16 is first read at a time 1 A (FIG. 2). If it is assured that the key switch 13 is in its off position during the reading of the I/O port 16, any zero signal level values determined at time 1 are a sure sign of a short circuit in the connection line 15*a*.

If it is to be determined whether the unit 12 or the key switch 13 are even available or connected to the evaluation circuit 10, the capacitor 15 is discharged at a time 2 in accordance with FIG. 2. This takes place in that at time 2 the charge of capacitor 15 is able to discharge via the output buffer 17.

If the capacitor 15 was completely discharged during the time period $t_u$, the output buffer 17 is again blocked at time 3 so that the capacitor 15 can be charged again via the resistor R1 during the time period $t_m$. If the signal level at the I/O port 16 is now read by the input buffer 18 at a time 4 that falls within the time period $t_m$ adjacent to the time period $t_u$, with an available capacitor 15 a signal level is detected which is below the signal level that existed at time 1 when the connection line 15*a* was intact, because of the charge in the capacitor 15.

However, to eliminate any direct reference with the signal level at time 1, a reference with a threshold value $U_g$ is now established for the signal level determined at the time 4. If the signal level determined at time 4 is below the threshold value $U_g$, it is a sure sign of an available unit 12, i.e. one that is connected to the evaluation circuit 10.

Figure 3:
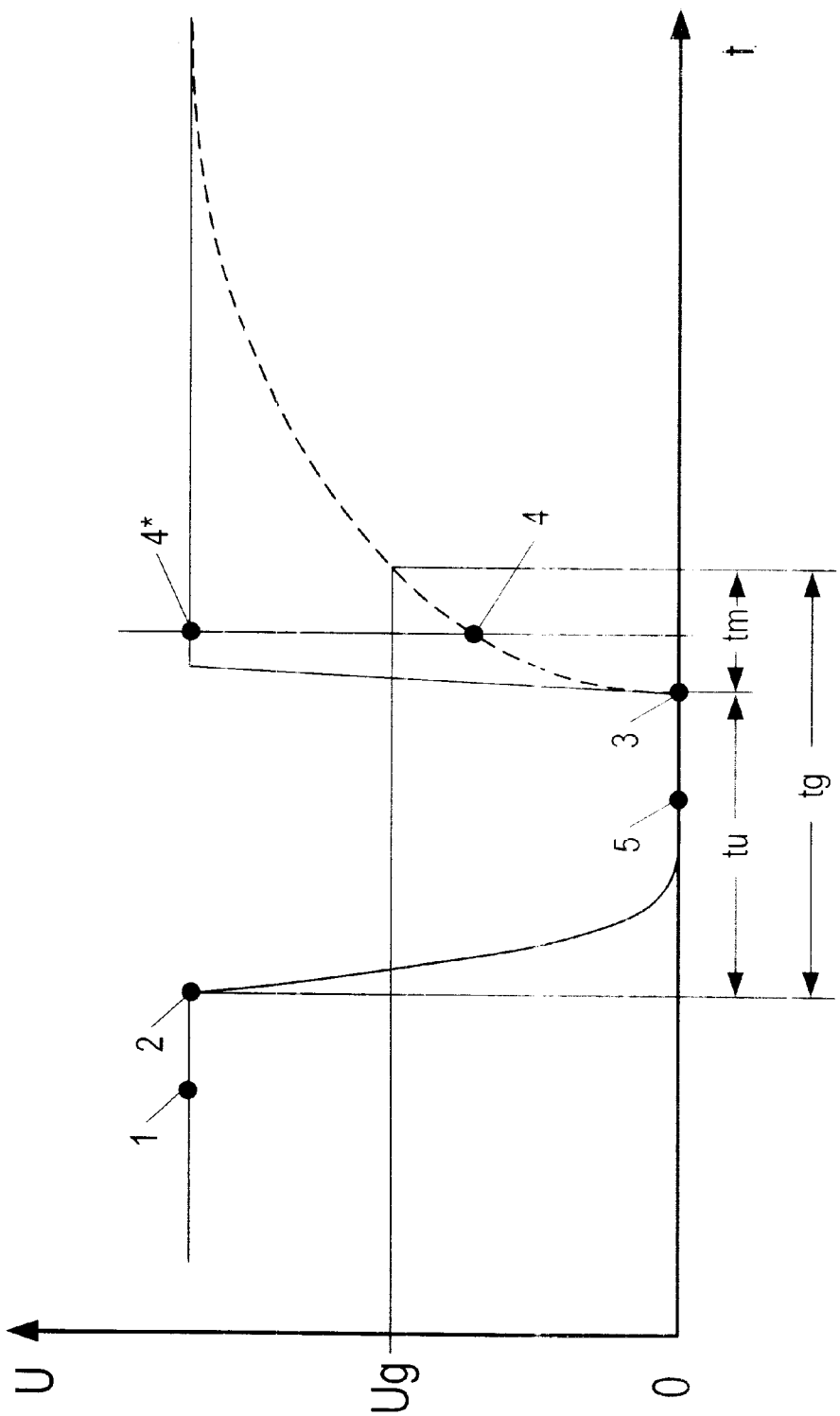
FIG. 3 is another illustration of the signal level versus time during the testing, in a case where the unit is not connected and the evaluation circuit is operating normally.

However, if the unit 12 containing the capacitor 15 was not connected, a signal level which is clearly above the threshold value $U_g$ would result at the time 4\*, which coincides with the time 4 within the time period $t_m$. These relationships are illustrated in greater detail in FIG. 3 where the charging curve in FIG. 2, the result of the connected capacitor 15, is shown by a dotted line for better understanding. Therefore the signal level determined at the time 4 or 4\* and referred to the threshold value $U_g$ can very simply determine the availability of the unit 12.

But if the evaluation circuit is designed like in DF-A19718041, the inventive arrangement of the input buffer 18 is unable to determine a signal level during the time period $t_u$. If the output buffer 17 is defective, at the time 4 or 4\* this defect is expressed by a signal level which lies above the threshold value $U_g$ exactly like an unavailable unit 12, and provides no information about the exact cause of the defect (defective output buffer 17 or unavailable unit 12). However if the input buffer 18 is arranged as indicated in FIG. 1, the signal level can even be detected during the time period $t_m$, since this arrangement permits the input buffer 18 to operate constantly because of the data lines 21, 21*a* between the buffers 17, 18 and the microcomputer 11.

Figure 4:
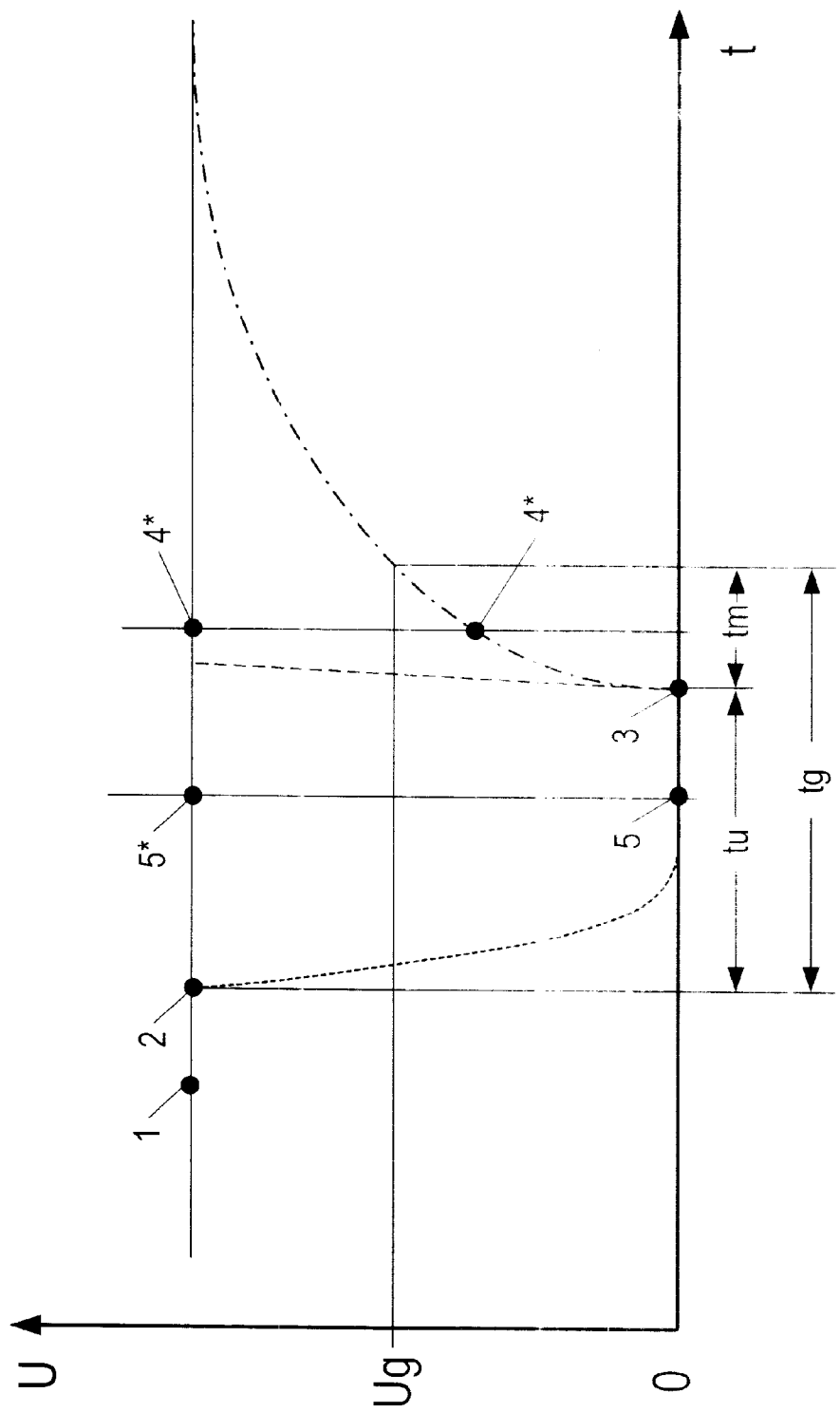
FIG. 4 is a further illustration of the signal level versus time during the testing, in a case where a component of the evaluation is defective.

For example if the output buffer 17 or the transistor 17*a* which is contained therein is defective and the time 2 is attained, the signal level during the time period $t_u$ is as shown by the continuous line in FIG. 4 and therefore does not differ from the signal level that prevails during the period before time 1, or during or after the time 4 or 4\*. For the known arrangement this means that with a defective output buffer 17 at the time 4 or 4\*, signal levels which are clearly above the threshold value $U_g$ are determined even if the unit 12 itself is error-free and is connected to the evaluation circuit 10. In contrast to the known device, the device of the invention is able to determine a signal level which prevails during the time period $t_u$ for example by a measurement performed at the time 5 on the entrance 20*a* of the input buffer 18 which is always active. If a measurement is performed at the time 5 and finds signal level to be zero as shown by the dotted line, it represents a functioning transistor 17*a* or output buffer 17. A defective transistor 17*a* or output buffer 17 exists if the signal level determined at the time 5 which coincides with time 5\* is at least above the threshold value $U_g$. For the sake of completeness it should be pointed out that if the transistor 17a or the output buffer 17 is functioning, depending on whether or not the unit 12 is connected to the I/O port 16 of the evaluation circuit 10, beginning at time 3 the signal level takes a course that was described in connection with FIG. 2 or 3. To illustrate these conditions, the respective prevailing courses of the signal levels at the time 2 are shown by a dot-dash line in FIG. 4.

Even if the unit 12 is built with a testing means 14 in the form of a capacitor 15 in accordance with this application, the use of the evaluation circuit 14 of the invention is not limited to the use of capacitors 15 as the testing means 14. Rather the constantly active input buffer 18 can also be used to determine the ability of the output buffer 17 to function with testing means 14 composed of an inductance or a resistance. In another not illustrated embodiment the key 13 can also be designed as a switch. The invention can also be used in the same way if the switch is designed as a two-way switch wired in series with the capacitor 15.

What is claimed is:

1. An evaluation circuit (10) for checking for the presence of a switch or key (13) in a d.c. circuit, comprising:
   a testing means (14) connected with the switch or key (13) to form a unit (12) having first and second terminals;
   an I/O port (16) connected to-one terminal of the unit (12);
   an input buffer (18) connected to the I/O port (16) for measuring the voltage at the I/O port (16);
   an output buffer (17) controllably connected to the I/O port (16);
   a charging resistor (R1) in series with the testing means (14) and also connected to a d.c. voltage source providing a source voltage (V+); and
   a microcomputer (11) for controlling the operation of the output buffer (17); wherein the microcomputer (11) controls the evaluation circuit (10) to determine the presence of the switch or key (13) in the d.c. circuit and the status of the output buffer (17) by performing the following operations.
   1) at time 1, determining the voltage at the I/O port (16);
   2) at time 2, controllably connecting the output buffer (17) to the I/O port (16) so as to cause the testing means (14) to be discharged within a discharge time period ($t_u$);
   3) at time 5, determining the voltage at the I/O port (16), where time 5 occurs during the discharge time period ($t_u$);
   4) at time 3, at the end of the discharge time period ($t_u$), controllably disconnecting the output buffer (17) from the I/O port (16) so as to allow the testing means (14) to charge to the source voltage (V+) via the charging resistor (R1); and
   5) at time 4, during a charging time period ($t_u$) following the discharging time period ($t_u$), measuring the voltage at the I/O port (16), where the charging time period ($t_m$) is substantially less than the amount of time necessary for the testing means to become fully charged;
   such that the presence of the switch or key (13) and the status of the output buffer (17) of the evaluation circuit (10) is 40 determined as follows:
   if at time 1 the measured voltage is greater than a predetermined voltage ($U_g$) less than the source voltage (V+), and at time 4 the measured voltage is less than the predetermined voltage ($U_g$), then determining that the switch or key (13) is present and that the output buffer (17) is operating normally;
   if the voltage measured at times 1, 5 and 4 are all greater than predetermined voltage ($U_g$), then determining that at least the output buffer (17) is faulty; and
   if the measured voltage at times 1 and 4 are both greater than the predetermined voltage ($U_g$) and if the measured voltage at time 5 is less than predetermined voltage ($U_g$), then determining that the switch or key (13) is not present and that the output buffer (17) is operating normally.

2. A method by which a microcomputer (11) of an evaluation circuit (10) is operative for checking for the presence of a switch or key (13) in a d.c. circuit, the evaluation circuit (10) including;
   a testing means (14) connected with the switch or key (13) to form a unit (12) having first and second terminals;
   an I/O port (16) connected to one terminal of the unit (12);
   an input buffer (18) connected to the I/O port (16) for measuring the voltage at the I/O port (16);
   an output buffer (17) controllably connected to the I/O port (16);
   a charging resistor (R1) in series with the testing means (14) and also connected to a d.c. voltage source providing a source voltage (V+); and
   the microcomputer (11), for controlling the operation of the output buffer (17); the method comprising the steps of;
   1) at time 1, determining the voltage at the I/O port (16);
   2) at time 2, controllably connecting the output buffer (17) to the I/O port (16) so as to cause the testing means (14) to be discharged within a discharge time period ($t_u$);
   3) at time 5, determining the voltage at the I/O port (16), where time 5 occurs during the discharge time period ($t_u$);
   4) at time 3, at the end of the discharge time period ($t_u$), controllably disconnecting the output buffer (17) from the I/O port (16) so as to allow the testing means (14) to charge to the source voltage (V+) via the charging resistor (R1); and
   5) at time 4, during a charging time period ($t_m$) following the discharging time period ($t_u$), measuring the voltage at the I/0 port (16), where the charging time period ($t_m$) is substantially less than the amount of time necessary for the testing means to become fully charged;
   and then determining the presence of the switch or key (13) and the status of the output buffer (17) of the evaluation circuit (10) according to the following rules:
   if at time 1 the measured voltage is greater than a predetermined voltage ($U_g$) less than the source voltage (V+), and at time 4 the measured voltage is less than the predetermined voltage ($U_g$), then determining that the switch or key (13) is present and that the output buffer (17) is operating normally;
   if the voltage measured at times 1, 5 and 4 are all greater than predetermined voltage ($U_g$), then determining that at least the output buffer (17) is faulty; and
   if the measured voltage at times 1 and 4 are both greater than the predetermined voltage ($U_g$) and if the measured voltage at time s is less than predetermined voltage ($U_g$), then determining that the switch or key (13) is not present and that the output buffer (17) is operating normally.

* * * * *

UNITED STATES PATENT AND TRADEMARK OFFICE
CERTIFICATE OF CORRECTION

PATENT NO. : 6,505,136 B1
DATED : January 7, 2003
INVENTOR(S) : Norbert Pieper

It is certified that error appears in the above-identified patent and that said Letters Patent is hereby corrected as shown below:

Column 5,
Line 24, "connected to-one terminal" should be -- connected to one terminal --.
Line 38, "following operations." should be -- following operations: --.
Line 53, "time period $t_u$ following" should be -- time period $t_m$ following --.
Line 61, "is 40 determined" should be -- is determined --.

Column 6,
Line 10, "including;" should be -- including: --.
Line 59, "at time s is" should be -- at time 5 is --.

Signed and Sealed this

Twenty-fifth Day of March, 2003

JAMES E. ROGAN
*Director of the United States Patent and Trademark Office*